United States Patent
Aoki et al.

(10) Patent No.: US 7,445,354 B2
(45) Date of Patent: Nov. 4, 2008

(54) LIGHT EMITTING APPARATUS

(75) Inventors: Yuko Aoki, Anan (JP); Hiroki Takahashi, Tokushima (JP)

(73) Assignee: Nichia Corporation, Anan-shi, Tokushima (JP)

( * ) Notice: Subject to any disclaimer, the term of this patent is extended or adjusted under 35 U.S.C. 154(b) by 0 days.

(21) Appl. No.: 11/527,387

(22) Filed: Sep. 27, 2006

(65) Prior Publication Data

US 2007/0096114 A1  May 3, 2007

(30) Foreign Application Priority Data

Sep. 27, 2005 (JP) .............................. 2005-279110

(51) Int. Cl.
*F21V 1/00* (2006.01)
(52) U.S. Cl. ....................... 362/241; 362/800; 362/240; 257/98; 257/100; 257/99
(58) Field of Classification Search ................. 362/800, 362/240–241, 236–238, 297–298, 301; 257/88–89, 257/98, 99–11, E33.056, E33.058, E33.059
See application file for complete search history.

(56) References Cited

U.S. PATENT DOCUMENTS

| 7,164,159 | B2* | 1/2007 | Park et al. ...................... 257/99 |
| 2002/0168604 | A1* | 11/2002 | Cao .............................. 433/29 |
| 2004/0120155 | A1* | 6/2004 | Suenaga ...................... 362/362 |

FOREIGN PATENT DOCUMENTS

JP  2004-207672 A  7/2004

* cited by examiner

*Primary Examiner*—John A. Ward
*Assistant Examiner*—Robert May
(74) *Attorney, Agent, or Firm*—Birch, Stewart, Kolasch & Birch, LLP (57) ABSTRACT

A light emitting apparatus comprises a light emitting element which has one of main surfaces thereof being used as a light emitting surface and a plurality of side faces having different areas, and a support member which has a recess with metallic members provided on the side wall surfaces thereof for reflecting the light emitted by the light emitting element. The light emitting element is placed in the recess so that the distance between the metallic member and a side face having the largest surface area among the plurality of side faces of the light emitting element is larger than the distance between the metallic member and the other side face.

5 Claims, 5 Drawing Sheets

LIGHT EMITTING APPARATUS

BACKGROUND OF THE INVENTION

1. Field of the Invention

The present invention relates to a light emitting apparatus which can be used as illumination apparatus, display, light source for backlight of liquid crystal display, etc. and, more particularly, to a light emitting apparatus having high reliability.

2. Description of the Related Art

Some of light sources used for illumination apparatus, backlight of liquid crystal display, etc. employ semiconductor light emitting element. The semiconductor light emitting element consumes less electric power than the conventional light sources, lasts longer and allow it to make the light emitting apparatus smaller, and is therefore preferably used. There is a demand for a light emitting apparatus which emits light with higher output power by using the semiconductor light emitting element.

In a light emitting apparatus of the prior art disclosed in Japanese Unexamined Patent Publication No. 2004-207672, for example, a support member whereon the light emitting element is mounted has wiring conductors that supply electric power to the light emitting element and reflecting walls for reflecting the light emitted by the light emitting element in an emission observing direction. The light emitting element is mounted at the bottom of a recess provided in the support member. The reflecting wall is formed from a laminated metallic member such as tungsten, nickel and silver or the like on the side wall surface of the recess of the support member which is formed mainly from ceramics.

However, with the trend toward higher output power of the light emitting element, the metallic member provided on the support member may experience deterioration including discoloration, due to the light and heat generated by the light emitting element. Silver, in particular, has high reflectivity to the light from the light emitting element and is therefore preferably used in the reflector wall of the support member, but is likely to deteriorate due to the light and heat generated by the light emitting element. As a result, a part of the light generated by the light emitting element is absorbed by the deteriorated silver, thus resulting in decreasing emission output power of the light emitting apparatus.

Also as the light emitting apparatus decreases in thickness, the distance between the side face of the light emitting element mounted on the bottom surface of the recess and the side wall surface of the recess may become smaller. This may cause the metallic member provided on the side wall surface of the recess to be greatly affected by the light emitted by the light emitting element.

SUMMARY OF THE INVENTION

Accordingly, an object of the present invention is to provide a light emitting apparatus which has a high output power and does not experience a decrease in the emission output power.

In order to achieve the object described above, the light emitting apparatus of the present invention comprises a light emitting element which has one of main surfaces thereof being used as a light emitting surface and a plurality of side faces having different areas, and a support member which has a recess with metallic members provided on the side wall surfaces thereof for reflecting the light emitted by the light emitting element, wherein the light emitting element is placed in the recess so that the distance between the metallic member and a side face having the largest surface area among the plurality of side faces of the light emitting element is larger than the distance between the metallic member and the other side face.

In the light emitting apparatus of the present invention, it is preferable that the light emitting element has main surface of oblong shape, the recess has a oblong bottom surface and a oblong opening, and the light emitting element is disposed in the recess so that the longitudinal direction of the light emitting element and the longitudinal direction of the recess cross each other at right angles.

Figure 1:
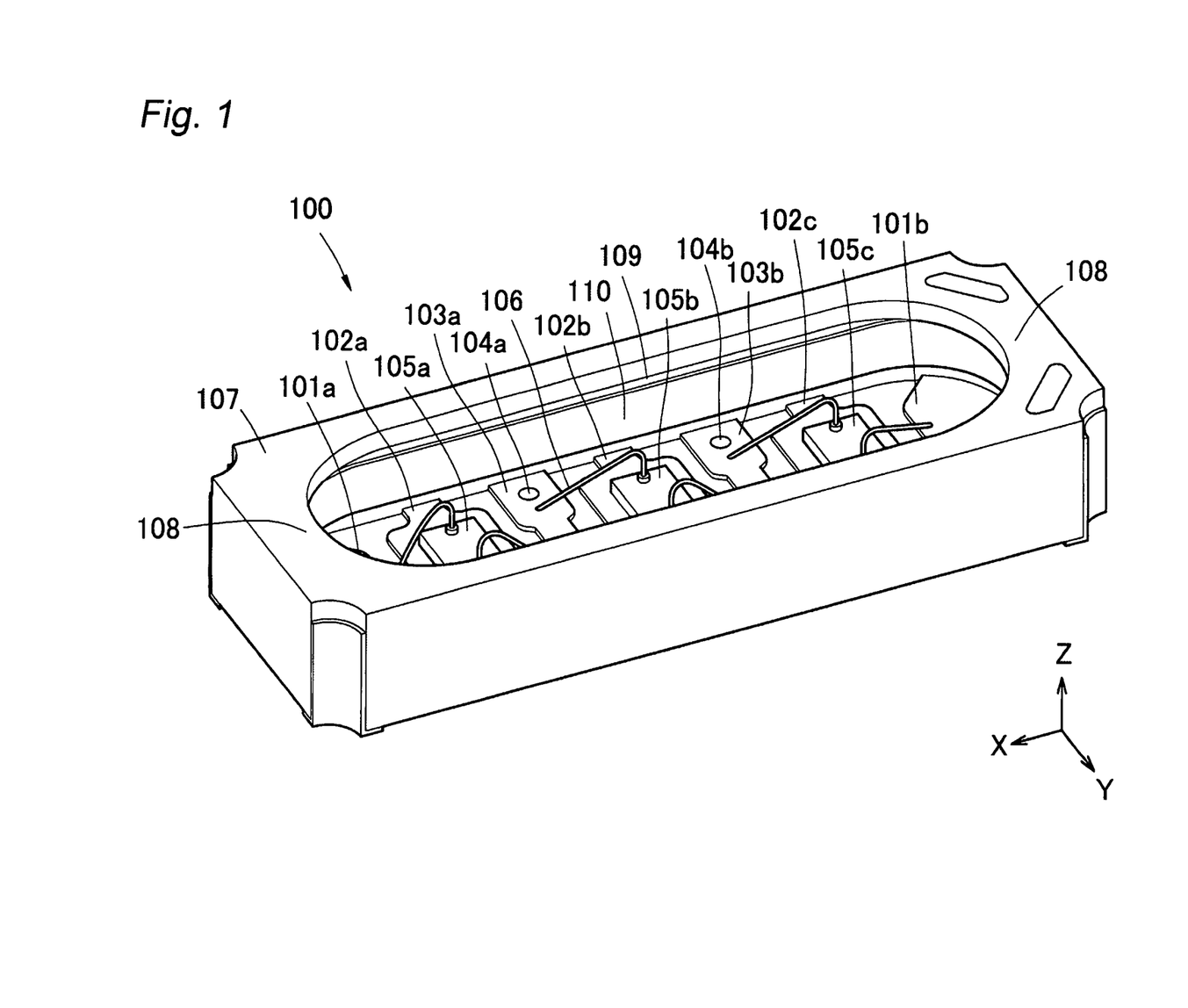
FIG. 1 is a perspective view of the light emitting apparatus according to one Example of the present invention.
Figure 2:
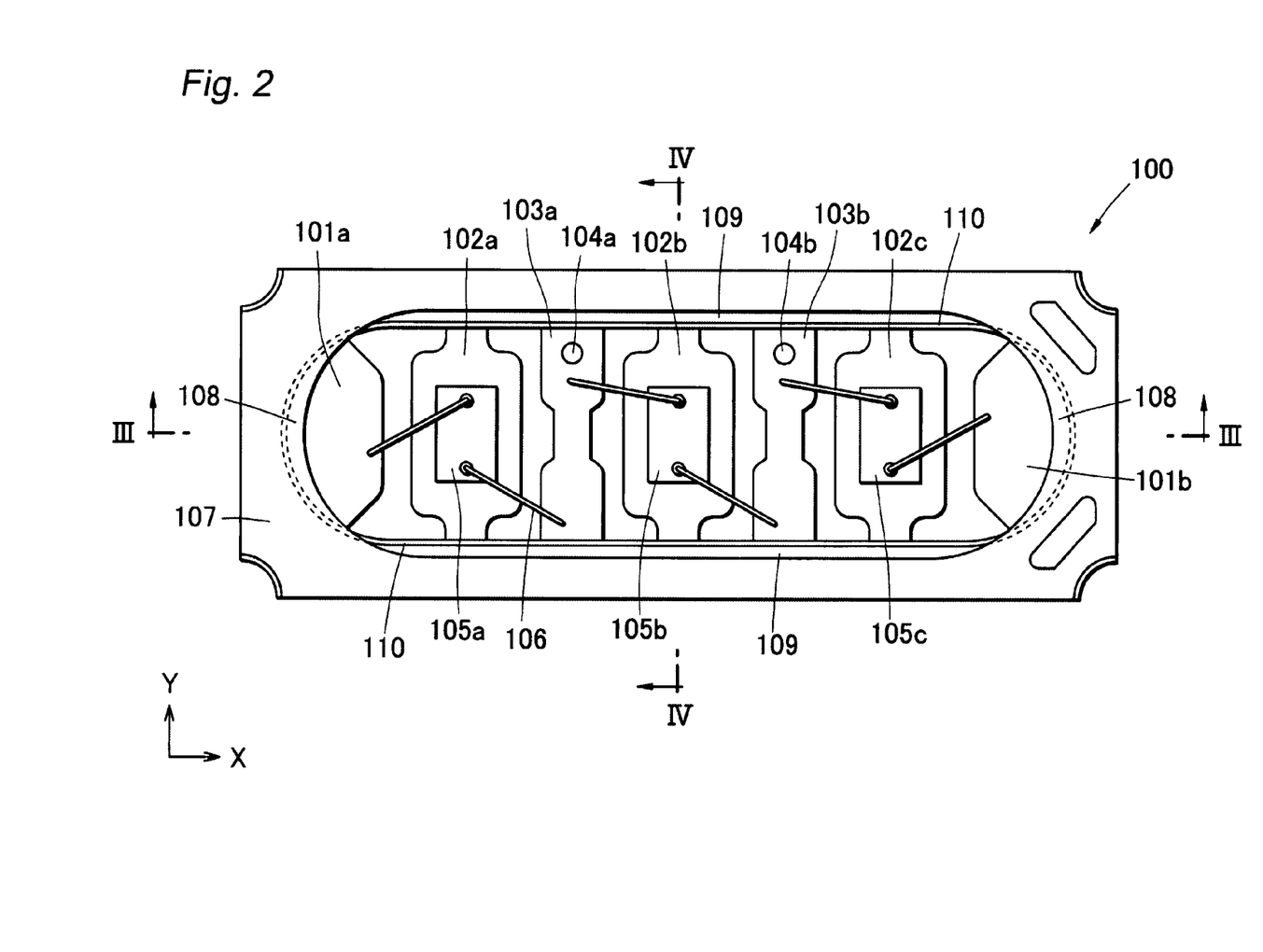
FIG. 2 is a top view of the light emitting apparatus according to one Example of the present invention.

The term "oblong shape" is intended to include oval shape shown in FIGS. 1 and 2, as well as rectangles.

In the light emitting apparatus of the present invention, it is preferable that the support member has protrusions on both sides in the longitudinal direction of the recess for holding a covering member which is disposed in the recess.

It is also preferable that the metallic member is formed excluding at least a part of the area on the end of the opening.

It is preferable that the main surface of the light emitting element has rectangular shape.

In the light emitting apparatus of the present invention, it is preferable that plural light emitting elements are disposed in the recess side by side.

In the light emitting apparatus of the present invention having such a constitution as described above, since the light emitting elements are placed in the recess so that the distance between the metallic member and a side face having the largest area becomes larger, light emerging from the side face is prevented from concentrating in a part of the metallic member, thereby preventing the metallic member from deteriorating.

DETAILED DESCRIPTION OF THE INVENTION

Best mode for carrying out the present invention will now be described with reference to the accompanied drawings. It should be understood, however, that the embodiments described below are intended to exemplify the light emitting apparatus that embodies the concept of the present invention, and do not limit the present invention.

This specification of patent application does not intend to limit the members and parts cited in the claims to those described in the embodiments. Dimensions, constituent materials, shape, relative positions and other features of the parts described in the embodiments are intended to be mere examples given for the purpose of explanation, rather than restricting the invention, unless otherwise stated in specific terms. Members may be shown in the drawings with exaggerated dimensions and/or relative positions for the purpose of making the explanation more understandable. In the description that follows, identical names and reference numerals denote identical or like members of which explanation will not be repeated. Each element that constitutes the present invention may be embodied either in such a manner as a plurality of elements are formed from a single material, or in such a manner as the function of a member is performed by a plurality of members.

The present inventors conducted a research for achieving the object described above with a light emitting apparatus comprising a light emitting element having a polygonal contour, a recess which accommodates the light emitting element to be placed on the bottom surface thereof, a support member having wiring conductors that connect the light emitting element and metallic members provided on the side wall surfaces of the recess.

The present invention solves the problems of the prior art, by disposing the light emitting element in the recess so that a side face having smaller surface area faces opposite to the nearest wall surface, so as to prevent light from being concentrated with high intensity on the wall surface which is nearer to the light emitting element, among the side wall surfaces of the recess.

In the first embodiment of the present invention, the side wall surface nearest to the light emitting element among the side wall surfaces of the recess is located on the side of the smallest of the sides constituting the contour of the light emitting element, thereby solving the problem described above. That is, in this example of the present invention, the side wall surface nearest to the light emitting element among the side wall surface of the recess is located on the side of the smallest of the sides that constitute the contour of the light emitting element. The side wall surface nearest to the light emitting element refers to the side wall surface which is at the smallest distance from the center of the area where the light emitting element is placed on the bottom surface of the recess, among the side wall surfaces of the recess. In other words, the nearest side wall surface is the side wall surface located at the smallest distance from the center of the contour of the light emitting element when the light emitting element is mounted.

According to the first embodiment of the present invention, the area through which the side face of the light emitting element and the metallic member provided on the side wall surface nearest to the light emitting element face with each other can be made smaller, thereby making it possible to decrease the intensity of light irradiated on the metallic member provided on the side wall surface nearest to the light emitting element. As a result, the influence on the side wall surface of the recess exerted by the light emerging from a side face of the light emitting element becomes smaller, thereby suppressing the deterioration of the metallic member placed on the side wall surface of the recess. Therefore, the light emitting apparatus having high output power can be made where the output power can be suppressed from decreasing even when used over a long period of time.

The light emitting apparatus according to the second embodiment of the present invention comprises a light emitting element having a polygonal contour, a support member having a recess which accommodates the light emitting element to be placed on the bottom surface thereof, and a metallic member provided at least on side wall surface of the recess, wherein the side wall surface of the recess has a first side wall surface and a second side wall surface that are located at different distance from the light emitting element when viewed from the opening of the recess, and the light emitting element is placed so that the smallest side of the sides which constitute the contour thereof faces the first side wall surface nearest to the light emitting element. The first side wall surface in this embodiment refers to a pair of side wall surfaces which extend in the X direction while facing each other when viewed from the opening of the recess. The second side wall surface refers to a pair of side wall surfaces which extend in the Y direction while facing each other. The side wall surfaces in this embodiment are formed such that the distance between the light emitting element and the first side wall surface is smaller than the distance between the light emitting element and the second side wall surface, while the nearest side wall surface is the first side wall surface.

According to the second embodiment of the present invention, the area through which the side face of the light emitting element and the metallic member provided on the first side wall surface nearest to the light emitting element face with each other can be made smaller, thereby making it possible to decrease the intensity of light irradiated on the metallic member provided on the first side wall surface. As a result, the influence on the first side wall surface exerted by the light emerging from a side face of the light emitting element becomes smaller, thereby suppressing the deterioration of the metallic member placed on the first side wall surface of the recess. Therefore, the light emitting apparatus having high output power can be made where the output power can be suppressed from decreasing even when used over a long period of time.

The light emitting apparatus of the present invention comprises a light emitting element which has one of main surfaces thereof being used as a light emitting surface and a plurality of side faces having different areas, and a support member which has a recess with metallic members provided on the side wall surfaces thereof for reflecting the light emitted by the light emitting element, wherein the light emitting element is placed in the recess so that the distance between the metallic member and a side face having the largest area among the plurality of side faces of the light emitting element is larger than the distance between the metallic member and the other side face, and the light emitting surface faces the opening surface of the recess.

With this constitution, light of higher intensity emitted from the side face of the largest area is diffused and irradiated on the side wall surface, and therefore deterioration of the metallic member formed on the side wall surface of the recess due to light can be prevented, and the output power can be suppressed from decreasing even when used over a long period of time.

Specific constitution of the light emitting apparatus according to configurations of the present invention will now be described in detail with reference to the accompanied drawings.

Configuration

Figure 3:
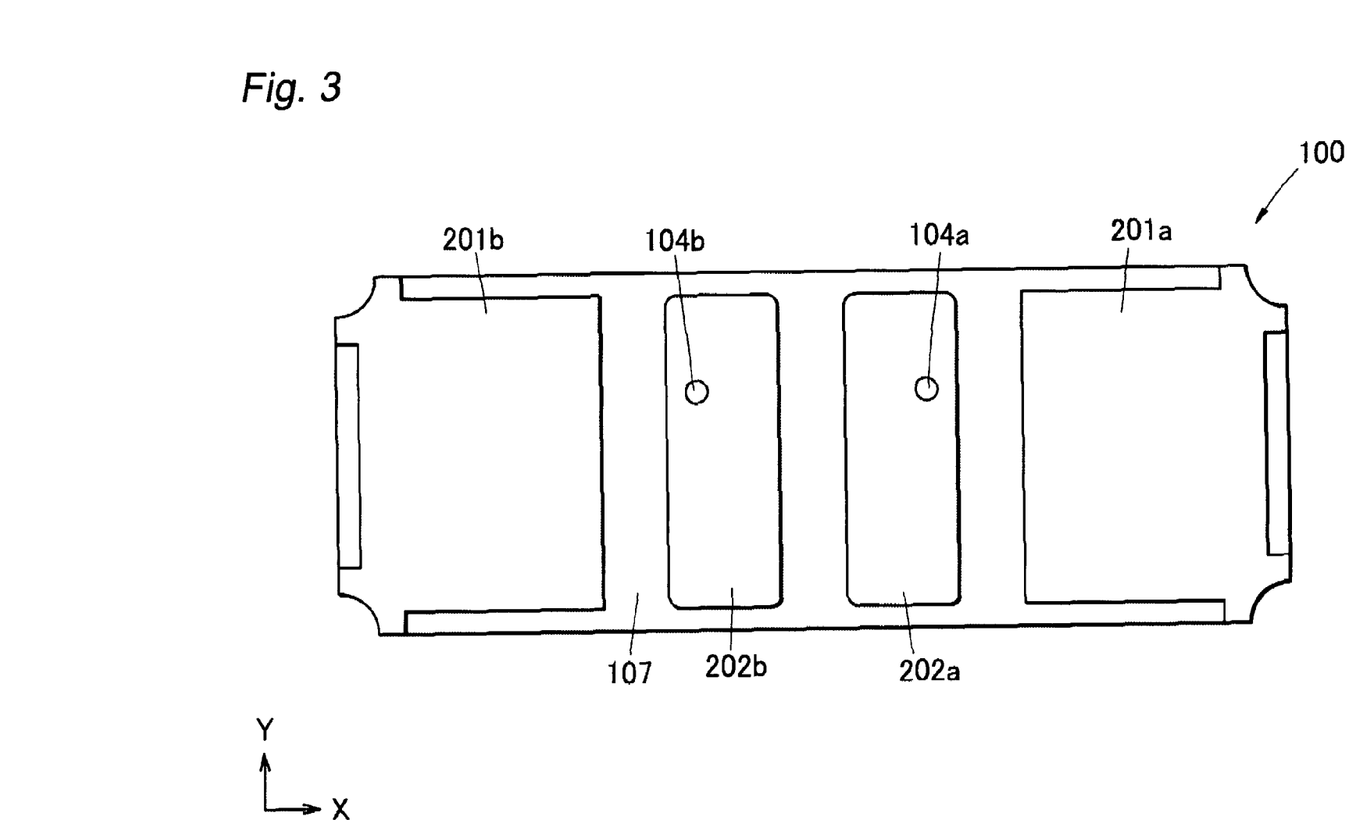
FIG. 3 is a rear view of the light emitting apparatus according to one Example of the present invention.

FIG. 1 is a perspective view of the light emitting apparatus according to this configuration. FIG. 2 is a top view of the light emitting apparatus according to this configuration viewed from the opening of the recess. FIG. 3 is a rear view of the light emitting apparatus according to this configuration.

As shown in FIGS. 1 and 2, the light emitting apparatus according to this configuration has three light emitting elements 105*a*, 105*b*, 105*c* having polygonal contour with first main surface on the light emitting surface side having rectangular shape and a support member having a recess formed therein, wherein the three light emitting elements 105*a*, 105*b*, 105*c* are placed side by side on the bottom surface of the recess.

In the support member of this configuration, the recess has an opening of oval shape, a bottom surface of oval shape, first side wall surfaces 301 (shown in FIG. 5) consisting of flat surfaces opposing each other and second side wall surfaces 302 (shown in FIG. 4) consisting of semi-circular surfaces opposing each other, where metallic members are provided on the bottom surface and on the wide wall surfaces as described below. Provided on the bottom surface of the recess are first metallic members 102a, 102b, 102c whereon the light emitting elements 105a, 105b, 105c are placed, while a second metallic member 103a to which a bonding wire is connected is provided between the first metallic member 102a and the first metallic member 102b, and a second metallic member 103b is provided between the first metallic member 102b and the first metallic member 102c. Provided on the bottom surface of the recess are a wiring conductor area 101a and a wiring conductor area 101b on the outside of the first metallic member 102a and the first metallic member 102c, respectively. Formed on the first and second side wall surfaces 301, 302 of the recess are metallic members 110 in a band shape.

In this configuration, the light emitting elements 105a, 105b, 105c have bonding pads of positive and negative polarities provided on the sides of the shorter sides of the first main surface which has rectangular shape, so that light is emitted when a voltage is applied via the bonding pads with the light emerging through the light emitting surface provided on the first main surface and the side face.

In the light emitting apparatus of this configuration, the light emitting elements 105a, 105b, 105c are provided on the first metallic member on the bottom surface of the recess, so that the distance between the metallic member provided on the side wall surface of the recess and a side face located on the longer side of the first main surface which has the largest area among the plurality of side faces of the light emitting element is larger than the distance between the metallic member provided on the side wall surface of the recess and the other side face of the light emitting element, and the side face located on the shorter side of the first main surface of the light emitting element opposes the first side wall surface 301 of the recess.

In other words, in the light emitting apparatus of this configuration, the distance between the first side wall surface 301 of the recess and the light emitting element is different from the distance between the second side wall surface 302 and the light emitting element, and the light emitting element is disposed so that the smallest of the sides constituting the contour of the first main surface faces the first side wall surface that is nearest thereto. In this configuration, the direction parallel to the first side wall surface of the recess is denoted as the X direction, and the direction parallel to the bottom surface of the recess and perpendicular to the X direction is denoted as Y direction.

By disposing the light emitting elements 105a, 105b, 105c on the first metallic members 102a, 102b, 102c which are provided on the bottom surface of the recess as shown in FIGS. 1 and 2, it is made possible to reflect the light from the light emitting elements 105a, 105b, 105c in the direction of observation, as well as improve the heat dissipation.

In this configuration, the recess of the support member has the second metallic members 103a, 103b mounted on the bottom surface thereof, while positive and negative electrodes of one of the light emitting elements 105a, 105c and positive and negative electrodes of the light emitting element 105b which is disposed at the center are connected to the second metallic members 103a, 103b via electrically conductive wires. This constitution makes it possible to connect the light emitting elements with each other without reducing the efficiency of extracting light emitted by the light emitting elements.

When it is attempted to directly connect the electrodes of the adjacent light emitting elements by means of the electrically conductive wires, for example, it is necessary to keep a large bonding area in the first main surface for connecting either of the light emitting elements by means of the electrically conductive wires, which results in a lower efficiency of extracting light emitted by the light emitting elements. Directly connecting the electrodes of a plurality of light emitting elements by means of electrically conductive wires causes the electrically conductive wires to warp and protrude significantly in the direction of opening of the recess. Such a bend of the electrically conductive wire is susceptible to thermal stress in the sealing member that covers the recess, and is likely to break.

In the light emitting apparatus of this configuration, however, a plurality of the light emitting elements are electrically connected by connecting the electrically conductive wires once to the second metallic members disposed between the light emitting elements. Specifically, the electrically conductive wires are drawn so as to electrically connect the electrodes of the adjacent light emitting elements via the second metallic member. This decreases the bend of the electrically conductive wires and, in turn, decreases the upward protrusion thereof. As a result, the light emitting apparatus of this configuration is capable of preventing troubles such as breakage of the electrically conductive wires from occurring due to the influence of the sealing member, thereby making the light emitting apparatus of high reliability.

The first metallic members 102a, 102b, 102c and/or the second metallic members 103a, 103b are preferably extended toward the nearest first side wall surface 301 with the ends being embedded in the wide wall. This constitution prevents the metallic member provided on the support member from peeling off, thereby making the light emitting apparatus of high reliability.

A narrow portion of the first metallic member that extends from the region where the light emitting apparatus is mounted toward the first side wall surface will be called the extended portion.

The first metallic member is preferably formed in a shape and dimensions which correspond to the shape and dimensions of the light emitting element to be mounted thereon, or a little larger. The second metallic member is preferably formed to be larger than the region to which the electrically conductive wire is connected. This constitution enables it to mount the light emitting elements and the electrically conductive wires in a stable manner and improve the capability of mass production of the light emitting apparatus.

In this configuration, it may necessarily be required to electrically isolate between the first metallic members and between the second metallic members or between the first metallic member and the second metallic member, depending on the way the plurality of light emitting elements are wired (path of supplying power). However, it is preferable to electrically isolate between the first metallic members and between the second metallic members or between first metallic member and the second metallic member. While the first metallic member 102a and the wiring conductor 101a or the first metallic member 102c and the wiring conductor 101b may be connected with each other in consideration of the path of supplying power, it is preferable to insolate between the first metallic member 102a and the wiring conductor 101a and between the first metallic member 102c and the wiring conductor 101b. When all the metallic members are isolated from each other in this way, short-circuiting can be surely prevented from occurring, while the material that constitutes the support member which is exposed between the metallic members can be firmly bonded to the covering member (sealing member) that fills the recess, and therefore the covering member can be prevented from peeling off, thereby making the light emitting apparatus of high reliability.

In the support member made of ceramics, for example, exposing the ceramic member between the first metallic member and the second metallic member makes it possible to manufacture the light emitting apparatus of high reliability since the covering member and the ceramics bond well with each other.

In this configuration, the second metallic members 103a, 103b are connected to the third metallic members 202a, 202b (shown in FIGS. 3, 4) which are provided on the back of the support member, via through holes that penetrate from the bottom of the recess to the back of the support member. Specifically, as shown in FIG. 1, FIG. 2 and FIG. 3, in this configuration, the second metallic members 103a, 103b are connected to the third metallic members 202a, 202b which are provided on the back of the support member, via through holes 104a, 104b. The through holes 104a, 104b are filled with a metallic member. With this constitution, heat dissipation of the light emitting apparatus is improved, thereby enabling it to manufacture the light emitting apparatus having high output power and high brightness. This constitution also makes it possible to constitute the light emitting apparatus having the plurality of light emitting elements connected in series with each other, or the light emitting apparatus having the plurality of light emitting elements connected in parallel with each other, without modifying the structure of the support member.

The wiring conductors 101a, 101b formed on the bottom surface of the recess are connected to the electrodes 201a, 201b which are formed on the back of the support member, respectively, by means of conductors formed in the notches provided at the corners of the support member.

In this configuration, the first metallic members 102a, 102b, 102c may also be connected to the metallic members formed on the back of the support member via the through holes that penetrate from the bottom of the recess to the back of the support member. This constitution improves heat dissipation of the light emitting apparatus further, thereby enabling it to manufacture the light emitting apparatus that emits light with higher brightness.

Figure 5:
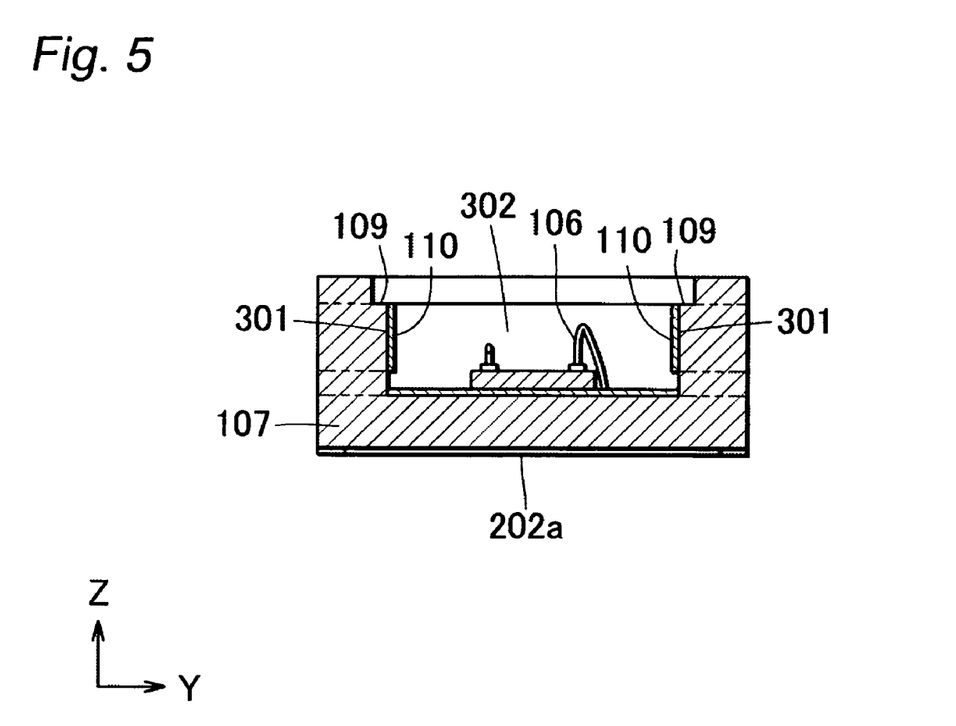
FIG. 5 is a sectional view along line IV-IV of the light emitting apparatus according to one Example of the present invention.

In the support member of this configuration, the first side wall surface 301 of the recess has a step 109 at the end of the opening so that the opening becomes wider, and the support member is exposed in the step 109 without the metallic member formed therein (FIG. 1, FIG. 2 and FIG. 5). In this configuration, the covering member (sealing member) is firmly bonded with the exposed surface of the support member in the step 109 with such a constitution described above, so that the covering member is prevented from peeling off.

The support member of this configuration has a protrusion 108 provided on the second side wall surface of the recess, so as to hold the sealing member located in the recess by means of the protrusion. The protrusion provided at the opening of the recess functions as holding means which prevents the sealing member located in the recess from coming off the recess. In the protrusion 108, the support member is exposed without the metallic member formed therein, so that the covering member (sealing member) is firmly bonded with the exposed surface of the support member and the covering member is prevented from peeling off, while the covering member is caused to enter below the projection 108, thereby preventing the covering member from coming off.

In this configuration, the opening of the recess is formed in an oval shape comprising straight line segments which oppose each other and arcs which oppose each other, but the present invention is not restricted to this constitution. According to the present invention, however, the opening is preferably formed in such a shape as oval or rectangle which has major axis and minor axis, that enables it to make the light emitting apparatus having reduced dimension in the direction of minor axis. Moreover, the light emitting apparatus having rectangular contour is preferably disposed so that the minor axis thereof corresponds to the major axis of the opening of the recess. This constitution makes it possible to make the light emitting apparatus of thin contour having high output power where the metallic member is suppressed from being deteriorated.

Now materials for the constituent elements and manufacturing method for this configuration will be described in detail below.

(Support Member)

The support member of this configuration has a recess in which the light emitting elements are mounted as described above, and includes metallic members as the metallic member 110 for constituting the light reflecting wall and metallic member and the electrically conductive wires provided in the recess. Therefore, the support member of this configuration is a lead frame made of aluminum or copper-clad iron as the main component, or a package formed from a resin and a lead frame by insertion molding.

A substrate of the support member in this configuration makes the base for mounting the metallic members such as the reflecting wall and the wiring conductor. The substrate of the support member may be glass epoxy resin, ceramics or glass. When ceramics is used, in particular, the support member having high heat resistance can be made.

As a ceramic material, alumina, aluminum nitride, mullite, silicon carbide or silicon nitride is preferably used.

Particularly preferable is a ceramic material made by sintering a powder consisting of 90 to 96% by weight of alumina and 4 to 10% by weight of a sintering additive such as clay, talc, magnesia, calcia and silica, at a temperature from 1500 to 1700° C., or a ceramic material made by sintering a powder consisting of 40 to 60% by weight of alumina and 60 to 40% by weight of a sintering additive such as borosilicate glass, kodurite, forsterite or mullite at a temperature from 800 to 1200° C.

The sheet-like support member shown in FIG. 2, for example, can be made by molding a material prepared by mixing a ceramic powder and a binder resin into green ceramic sheets, processing the green sheets as required, stacking the sheets and firing the stack.

For example, an electrically conductive paste which includes fine particles of metal having high melting point such as tungsten or molybdenum is applied onto a ceramic green sheet in patterns of the first metallic member, the second metallic member and the wiring conductors, so as to prepare a first green sheet.

Through hole is formed in a ceramic green sheet in a shape corresponding to the cross section of the recess of the support member, so as to prepare a second green sheet.

Through hole is formed in a ceramic green sheet in a shape corresponding to the cross section of the recess of the support member, and an electrically conductive paste which includes fine particles of metal having high melting point such as tungsten or molybdenum is applied onto the inner surface of the recess, so as to prepare a third green sheet.

Last, through hole is formed in a green ceramic sheet in a shape corresponding to the cross section of the recess at the opening end side of the support member, so as to prepare a fourth green sheet.

The opening formed in the fourth green sheet has the step 109 and the protrusion 108 formed at the upper end of the recess of the support member, and therefore the length along the major axis is shorter than the openings formed in the second green sheet and the third green sheet by the length corresponding to the protruding length of the projection, and the length along the minor axis is shorter by the length corresponding to the step 109.

The opening in the second green sheet and the opening in the third green sheet are formed in the same shape.

The first through fourth green sheets prepared as described above are stacked and fired, then the base layer formed from a metal having high melting point such as tungsten or molybdenum in the recess is plated with nickel and then gold or silver. It is preferable that the surfaces of the metallic members formed on the first and second side wall surfaces are coated with silver which has high reflectivity to the light emitted by the light emitting element.

While the base layer is formed in the stage of green sheet before firing in the method described above, the metallic members and the wiring conductors may be formed in the predetermined shapes on the substrate of the support member after firing, according to the present invention.

(Light Emitting Element)

The light emitting element is, for example, light emitting diode or the like which can serve as the light source for the light emitting apparatus. A light receiving element and a protective element (such as zener diode or capacitor) which protects the light emitting element from destruction due to over voltage, or a combination thereof may be mounted together with the light emitting element on the support member.

Contour of the light emitting element in plan view may be any shape which can be formed in the process of manufacturing the light emitting element, including polygon such as triangle, rectangle or hexagon. Contour of the light emitting element in plan view is preferably, in particular, rectangle. With such a shape, the light emitting apparatus can be suitably manufactured in mass production, since the semiconductor wafer can be easily separated into individual light emitting elements in the process of manufacturing the light emitting element.

Now LED chip will be described below as an example of the light emitting element used in the present invention. The LED chip may be made from various semiconductor materials such as ZnSe and GaN. In order to make the light emitting apparatus having a fluorescent material, it is preferable to use a nitride semiconductor ($In_xAl_yGa_{1-x-y}N$, $0 \leq X$, $0 \leq Y$, $X+Y \leq 1$) which can emit light of a short wavelength capable of efficiently exciting the fluorescent material. Wavelength of light emitted by the compound semiconductor layer can be selected by the mixing proportion of the crystal. The LED chip may be a light emitting element which emits ultraviolet ray or infrared ray, as well as visible light.

While the light emitting element is connected to the metallic member of the support member by means of wires in this configuration, electrodes of the light emitting element may also be connected to the metallic member of the support member via electrically conductive members called bump, or may be electrically and mechanically connected to wiring conductor of auxiliary member called sub-mount.

The light emitting element may be secured onto the first metallic member by using an electrically conductive bonding material such as gold paste or silver paste, a eutectic material that includes at least one element selected from among Au, Ag, Bi, Cu, In, Pb, Sn and Zn (for example, Au—Sn), a brazing material that includes at least one element selected from among Au and Ag, or an adhesive resin such as epoxy resin (light-transmitting resin when required).

(Covering Member)

The covering member (may also be referred to as sealing member) protects the light emitting element and the wiring conductors which are placed in the recess of the support member from dust, moisture and external force. The covering member may be formed from, for example, silicone resin, epoxy resin or urea resin. The covering member may include various additives such as coloring agent, light stabilizer, fluorescent material as required. Specifically, a coloring agent such as pigment or dye is added in order to shut off radiation of undesirable wavelength depending on the wavelength of light emitted by the light emitting element.

The fluorescent material which may be included in the covering member converts the light emitted by the light emitting element, and the efficiency of conversion is higher when converting the light emitted by the light emitting element to a longer wavelength. In case the light emitted by the light emitting element is visible light of a short wavelength which has high energy, yttrium aluminum garnet fluorescent material (hereinafter referred to as YAG:Ce), which is a kind of oxide aluminum-based fluorescent material, is preferably used. The YAG:Ce fluorescent material absorbs a part of light having bluish color from the LED chip and emits yellow light, complementary color of the former, and therefore a light emitting diode that emits white light by mixing different colors with high output power can be formed relatively easily.

(Holding Means)

The holding means holds the covering member onto the support member, so as to prevent the covering member located on the support member from coming off the support member. The holding means may be shaped as the protrusion 108 described in the configuration, or a hook provided on the inner surface of the recess of the support member. The protrusion described in the configuration wherein a part of the inner wall surface of the recess protrudes so that the recess of the support member becomes narrower toward the opening may be preferably employed as the holding means. The holding means may be formed separately at a plurality of positions, or formed in a combination of a plurality of shapes.

The holding means is preferably provided in such a manner as to oppose each other with the minor axis interposed therebetween in the opening of the recess. That is, it is preferable to provide the holding means at the opening of the side wall located at larger distance from the light emitting element, among the plurality of side walls that surround the light emitting element. This constitution makes it possible to make the light emitting apparatus having high output power where the metallic member is suppressed from being deteriorated.

Examples of the present invention will now be described in detail. It goes without saying that the present invention is not limited to the following examples.

EXAMPLE

Figure 4:
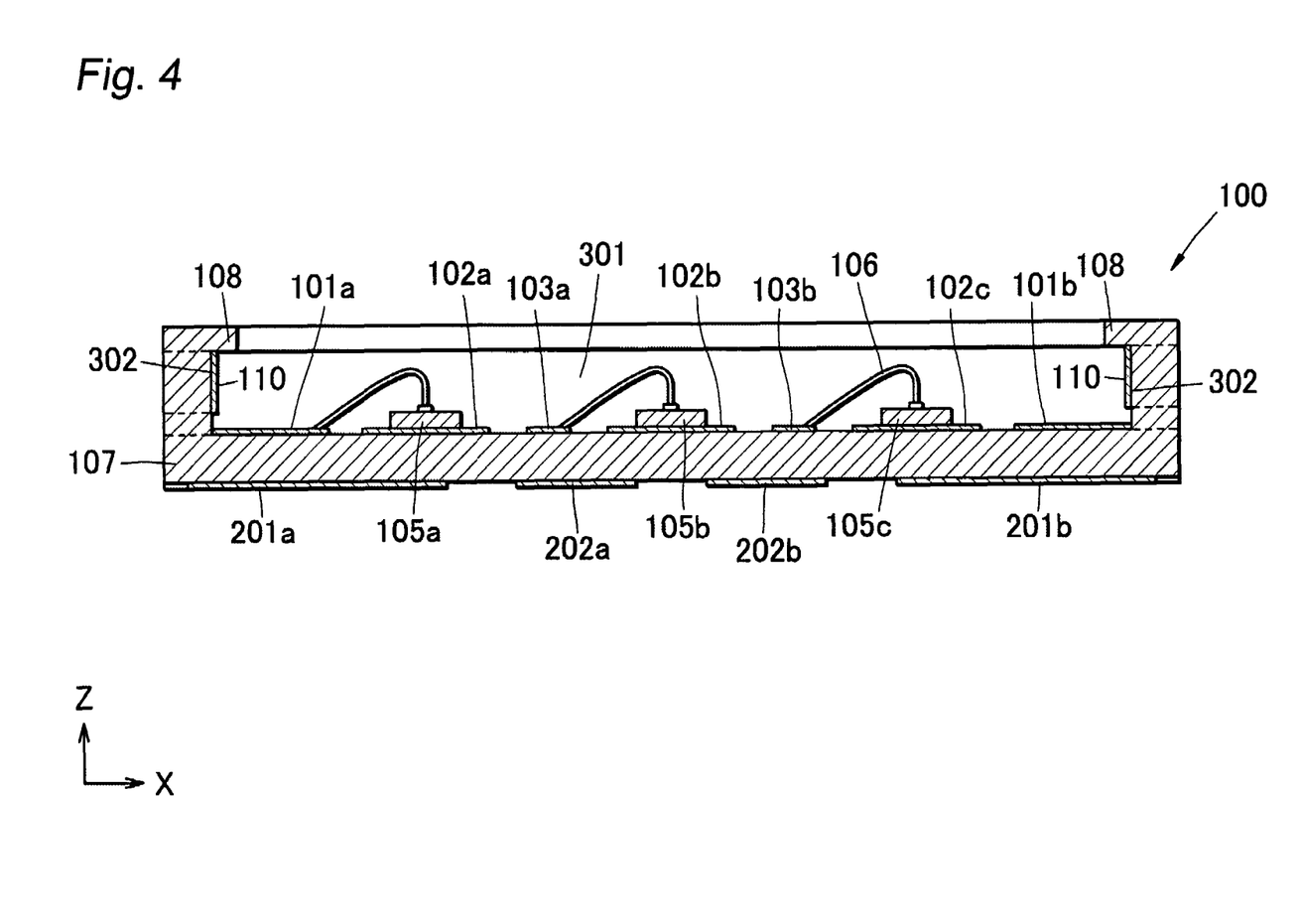
FIG. 4 is a sectional view along line III-III of the light emitting apparatus according to one Example of the present invention.

FIG. 1 is a perspective view of the light emitting apparatus according to one Example of the present invention. FIG. 2 is a top view of the light emitting apparatus according to this example viewed from the opening of the recess. FIG. 3 is a rear view of the light emitting apparatus according to this example viewed from the side opposite to the side where the recess is formed. FIG. 4 is a sectional view along X axis direction of the light emitting apparatus of this example. FIG. 5 is a sectional view along Y axis direction of the light emitting apparatus of this example. In FIG. 4 and FIG. 5, Z axis is defined as the direction from the bottom surface of the recess of the support member toward the opening.

The light emitting apparatus of this example comprises LED chips 105*a*, 105*b*, 105*c* having rectangular contour and the support member having the recess wherein the LED chips are mounted at the bottom surface thereof. The support member has the substrate made of ceramics, the metallic member formed as a reflector from tungsten, nickel or silver on the side wall surface of the recess that is formed on the substrate, the first metallic members 102*a*, 102*b*, 102*c* and second metallic members 103*a*, 103*b* formed from the same material on the bottom surface of the recess and the electrodes 201*a*, 201*b* provided on the external surface of the support member and the electrically conductive wires 101*a*, 101*b* respectively connected thereto. The first metallic members 102*a*, 102*b*, 102*c* are disposed so as to interpose the second metallic members 103*a*, 103*b* when viewed from the opening of the recess. That is, the second metallic members 103*a*, 103*b* are disposed between the first metallic members 102*a*, 102*b*, 102*c*. The first metallic members 102*a*, 102*b*, 102*c* are disposed on the substrate apart from the wiring conductors 101*a*, 101*b* and from the second metallic members 103*a*, 103*b* so as to be electrically isolated therefrom.

The support member of this example has the pair of first side wall surfaces 301 which extend in X axis direction and oppose each other via the LED chip and the pair of second side wall surfaces 302 which extend in Y axis direction and oppose each other via the LED chip, as shown in FIG. 1 FIG. 2, FIG. 4 and FIG. 5. The support member of this example has a shape of rectangular parallelepiped measuring 4.3 mm in length, 1.6 mm in width and 0.65 in depth. The first side wall surfaces 301 have the step 109 in the opening of the recess, where the metallic member 110 is not formed in the step and the ceramic surface is exposed.

The recess of the support member in this example is formed from the first side wall surfaces 301 and the second side wall surfaces 302. Opening of the recess has oval shape, and the second side wall surfaces 302 that includes the arc which constitute the oval shape has the protrusion 108 which protrudes toward the inside of the recess in the opening of the recess. Provided in the recess is the sealing member that covers the LED chips and the electrically conductive wires, and the protrusion serves as the holding means for the covering member. The sealing member is made of silicone resin that includes YAG:Ce fluorescent material, so that the light emitting apparatus can emit light having wavelength converted by the YAG:Ce fluorescent material from the light of the LED chip. In case the LED chip emits light of bluish color, the light emitting apparatus can emit light of blended color of the light from the LED chip and light from the YAG:Ce fluorescent material.

Each of the LED chips of this example has a contour measuring 240 µm by 420 µm. The LED chips 105*a*, 105*b*, 105*c* are secured onto the first metallic members 102*a*, 102*b*, 102*c* by means of an adhesive with the direction of the minor axis coincident with the direction of major axis (X axis direction in FIG. 2) of the opening of the recess. That is, the LED chips 105*a*, 105*b*, 105*c* are disposed so that the smallest side among the sides that constitute the rectangular contour is directed toward the first side wall surface 301 which is nearest to the center of the first metallic members 102*a*, 102*b*, 102*c*.

The LED chips 105*a*, 105*b*, 105*c* are disposed at equal distance of about 0.8 mm from each other on the first metallic members 102*a*, 102*b*, 102*c*. Distance between the LED chips disposed on the support member as in this example is preferably 0.1 mm or more. This improves the efficiency of extracting light from the recess of the support member and decreases the density of light in the recess. As a result, the metallic members are less affected by the light emitted by the light emitting element, so that the light emitting apparatus having high output power where the metallic member is suppressed from being deteriorated.

Electrodes of the LED chips are connected by the electrically conductive wires to the wiring conductors 101*a*, 101*b* and the second metallic members 103*a*, 103*b*. More specifically, one of the electrodes of the LED chip 105*a* is connected to the wiring conductor 101*a* and the other electrode is connected to the second metallic member 103*a*. One of the electrodes of the LED chip 105*b* is connected to the second metallic member 103*a* and the other electrode is connected to the second metallic member 103*b*. One of the electrodes of the LED chip 105*c* is connected to the second metallic member 103*b* and the other electrode is connected to the wiring conductor 101*b*. Thus the three LED chips are electrically connected in series.

As shown in FIG. 2 and FIG. 3, the support member has the through holes 104*a*, 104*b* which connect the second metallic members 103*a*, 103*b* provided on the bottom surface of the recess and the third metallic members 202*a*, 202*b* formed on the back of the support member. This constitution improves the heat dissipation of the light emitting apparatus and enables it to make the light emitting apparatus which emits light with high brightness.

The light emitting apparatus of this example can provide high output power by suppressing the metallic members provided on the side wall surface of the recess from being deteriorated.

The present invention can be used as illumination apparatus, display, light source for the backlight of liquid crystal display, etc.

What is claimed is:

1. A light emitting apparatus comprising:
   a light emitting element having one of main surfaces as a light emitting surface and side faces having different areas;
   a supporting member having a recess portion and a metallic member provided on side wall surface of the recess;
   wherein the light emitting element is disposed in the recess so that a distance between the side face having a largest area and the metallic member is larger than distances between the other side faces and the metallic member,
   wherein the supporting member has protrusions on both sides of the recess for holding a covering member which is disposed in the recess, the protrusions protruding into the recess, and
   wherein distances between the sides having the protrusions and the light emitting element are longer than distances between sides not having the protrusions and the light emitting element.

2. The light emitting apparatus according to claim 1;
   wherein said one main surface has a oblong shape, and the recess has an oblong bottom surface and an oblong opening,
   wherein the light emitting element is disposed in the recess so that a longitudinal direction of the light emitting element is perpendicular to a longitudinal direction of the recess.

3. The light emitting apparatus according to claim 1; wherein the metallic member is formed on the side wall surface except for at least portion near to the opening.

4. The light emitting apparatus according to claim 1; wherein a shape of the main surface of the light emitting element is a rectangle.

5. The light emitting apparatus according to claim 1; wherein the light emitting apparatus has a plurality of the light emitting elements disposed side by side.

* * * * *